(12) United States Patent
Peng et al.

(10) Patent No.: US 7,885,073 B2
(45) Date of Patent: Feb. 8, 2011

(54) HEAT DISSIPATION DEVICE

(75) Inventors: Xue-Wen Peng, Shenzhen (CN); Jun-Hai Li, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 0 days.

(21) Appl. No.: 12/482,405

(22) Filed: Jun. 10, 2009

(65) Prior Publication Data

US 2010/0271774 A1 Oct. 28, 2010

(30) Foreign Application Priority Data

Apr. 23, 2009 (CN) .................. 2009 1 0301772

(51) Int. Cl.
*H05K 7/20* (2006.01)
(52) U.S. Cl. .................. 361/700; 165/104.33; 361/694; 361/695
(58) Field of Classification Search ............. 361/700
See application file for complete search history.

(56) References Cited

U.S. PATENT DOCUMENTS

| | | | | |
|---|---|---|---|---|
| 5,694,295 A | * | 12/1997 | Mochizuki et al. | 361/699 |
| 6,082,443 A | * | 7/2000 | Yamamoto et al. | 165/104.26 |
| 6,671,177 B1 | * | 12/2003 | Han | 361/719 |
| 7,342,306 B2 | * | 3/2008 | Colbert et al. | 257/712 |
| 7,551,442 B2 | * | 6/2009 | Stefanoski | 361/700 |
| 7,599,185 B2 | * | 10/2009 | Meyer et al. | 361/700 |
| 7,697,293 B1 | * | 4/2010 | Peng et al. | 361/700 |
| 7,755,902 B2 | * | 7/2010 | Peng et al. | 361/719 |
| 2009/0059524 A1 | * | 3/2009 | Peng et al. | 361/697 |
| 2009/0059525 A1 | * | 3/2009 | Peng et al. | 361/697 |
| 2009/0219695 A1 | * | 9/2009 | Tomioka | 361/700 |

* cited by examiner

*Primary Examiner*—Gregory D Thompson
(74) *Attorney, Agent, or Firm*—Frank R. Niranjan

(57) ABSTRACT

A heat dissipation device is adapted for dissipating heat generated from an add-on card which has a plurality of processors thereon. The heat dissipation device includes a vapor chamber and a mounting member. The vapor chamber thermally contacts with the processors. The mounting member is mounted on a bottom surface of the vapor chamber. A plurality of screws extends through the add-on card and engages with the mounting member to assemble the vapor chamber on the add-on card.

20 Claims, 4 Drawing Sheets

HEAT DISSIPATION DEVICE

BACKGROUND

1. Technical Field

The present invention relates to heat dissipation devices and, particularly, to a heat dissipation device having a vapor chamber contacting a plurality of spaced electronic components, simultaneously.

2. Description of Related Art

An add-on card such as a graphics card generally comprises a first processor and a second processor to enhance a computation speed and an operation efficiency of an electronic device having the add-on card. Two heat sinks contact the first and second processors, respectively, to dissipate heat generated from the two processors. In use, heat generated by the first processor is larger than that of the second processor. The heat sink contacting the first processor may not be able to sufficiently dissipate heat generated by the first processor, while the heat dissipating capability of the heat sink contacting the second processor may not be sufficiently utilized, whereby the first processor may overheat to have an unstable operation or even a malfunction.

What is needed, therefore, is a heat dissipation device which can overcome the above-described problems.

DETAILED DESCRIPTION

Figure 1:
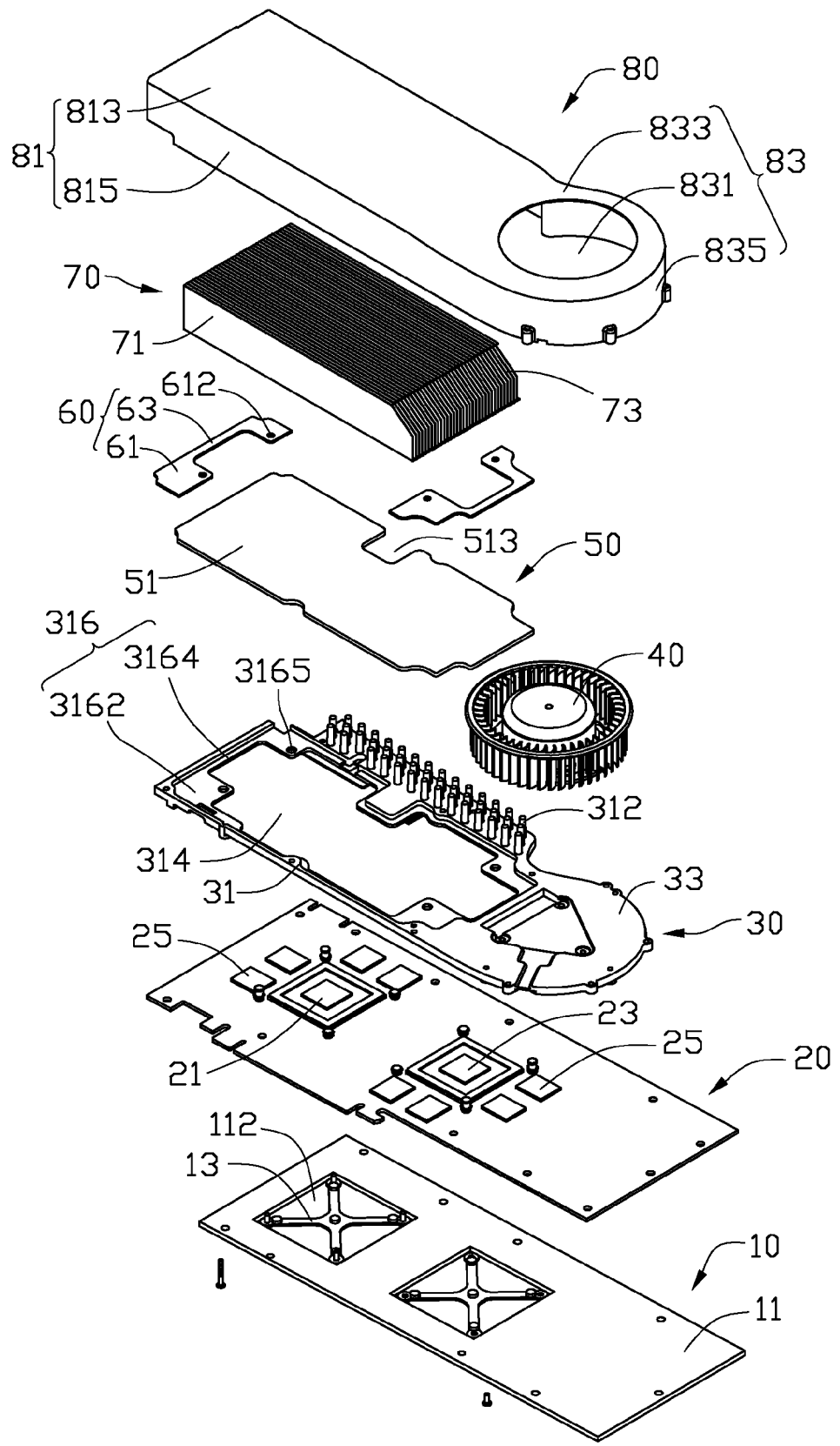
FIG. 1 is an exploded view of a heat dissipation device in accordance with an embodiment of the present disclosure, and an add-on card mounted on the heat dissipation device.
Figure 2:
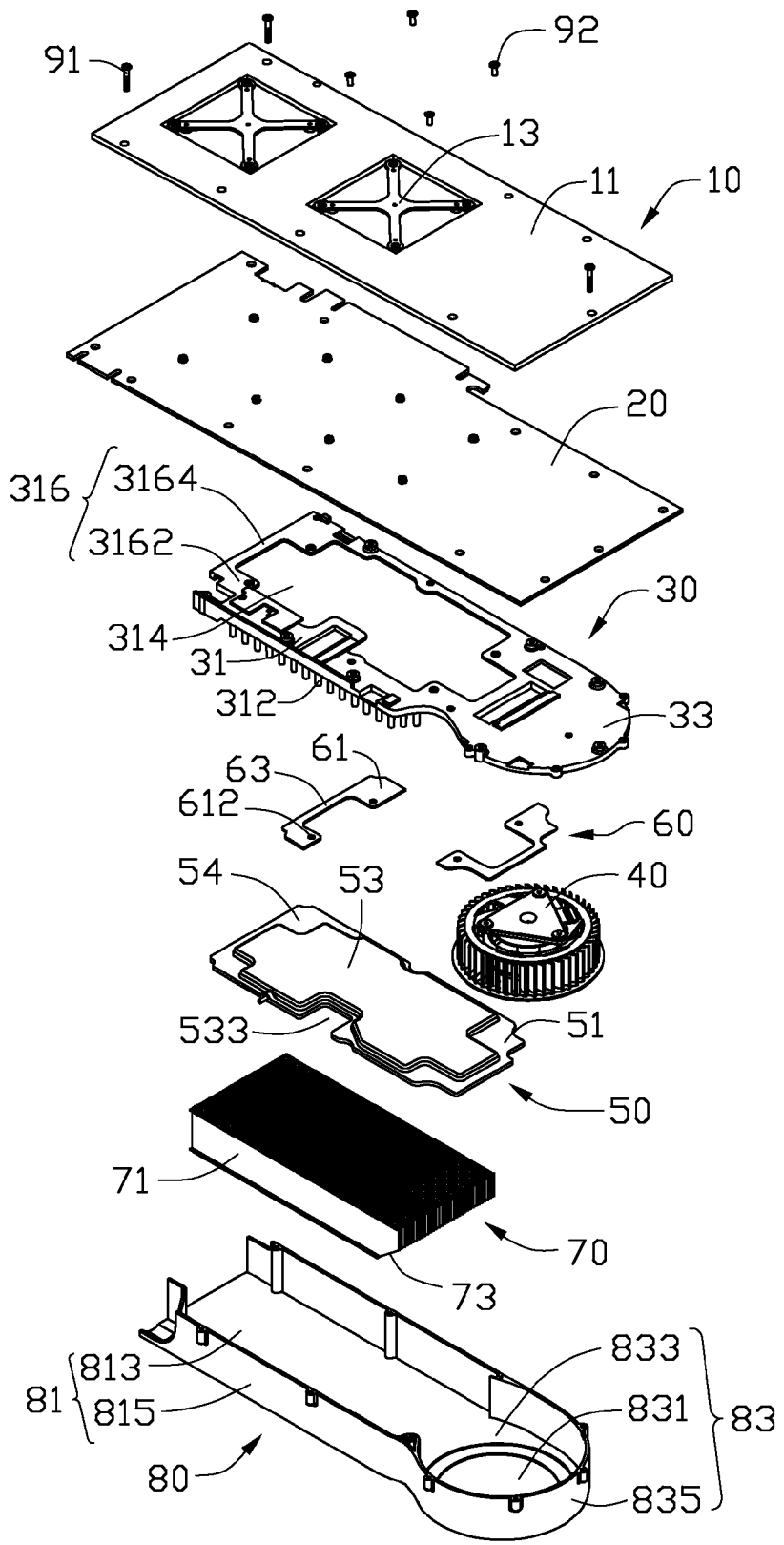
FIG. 2 is an inverted view of the heat dissipation device and the add-on card of FIG. 1.

Referring to FIGS. 1-2, a heat dissipation device of the present disclosure is used for dissipating heat from an add-on card 20. The add-on card 20 comprises a first processor 21, a second processor 23 spaced from the first processor 21, and a number of other electronic components 25 around the first and second processors 21, 23. Heat generated by each of the first and second processors 21, 23 is larger than that of the electronic components 25. That is, the first and second processors 21, 23 are main heat generating elements relative to the electronic components 25. The heat dissipation device comprises a bracket 30 mounted on a top of the add-on card 20 and contacting the other electronic components 25, a vapor chamber 50 sitting on the bracket 30 and thermally contacting the first and second processors 21, 23, a fin group 70 mounted on a top of the vapor chamber 50, a fan 40 mounted on a side of the bracket 30, a fan cover 80 mounted on the bracket 30 and covering the fan 40 and the fin group 70, and a back plate 10 mounted on a bottom of the add-on card 20. The back plate 10 supports the add-on card 20 and connects the vapor chamber 50.

The back plate 10 comprises an elongated heat absorbing plate 11 and two cross-shaped supporting members 13. The heat absorbing plate 11 is made of aluminum, copper or an alloy thereof. The heat absorbing plate 11 is fixed on a bottom surface of the add-on card 20 and thermally contacts with the add-on card 20. The heat absorbing plate 11 defines two spaced, rectangular openings 112 to receive the two supporting members 13 therein. The two supporting members 13 extend through the two openings 112 and are fixed on the add-on card 20 at positions where the first and second processors 21, 23 are located.

The bracket 30 is made of aluminum and comprises a rectangular engaging portion 31 and a semicircular extending portion 33 extending outwardly from an end of the engaging portion 31. A number of pins 312 extend upwardly from a side of the engaging portion 31. The pins 312 are arrayed along a length direction of the engaging portion 31. The pins 312 dissipate heat absorbed by the bracket 30. The engaging portion 31 defines a rectangular opening 314 at a central portion thereof. The engaging portion 31 includes two U-shaped flanges 316 at two lateral ends of the opening 314, respectively. Each of the flanges 316 comprises two rectangular, spaced supporting plates 3162 and a connecting plate 3164 interconnecting the supporting plates 3162. The four supporting plates 3162 are located at four corners of the engaging portion 31, respectively. Each of the supporting plates 3162 defines a mounting hole 3165 to receive a screw 92. The two connecting plates 3164 are located at lateral sides of the engaging portion 31 and connect with the two corresponding supporting plates 3162, respectively. The vapor chamber 50 is received in the opening 314 and sits on the flanges 316. The vapor chamber 50 contacts the first and second processors 21, 23, and thermally connects therewith. A bottom surface of the engaging portion 31 contacts the other electronic components 25 of the add-on card 20 and thermally connects therewith. The fan 40 is mounted on a central portion of the extending portion 33 to generate airflow to cool the vapor chamber 50.

The vapor chamber 50 comprises a rectangular top plate 51 and a bowl-shaped bottom plate 53 engaging with the top plate 51. The bottom plate 53 is fixed on a bottom of the top plate 51 to form a hermetical chamber (not labeled) therebetween. The hermetical chamber receives a working fluid and a wick structure therein. The top plate 51 defines a U-shaped cutout 513 at a side thereof to prevent an interference of the vapor chamber 50 with the bracket 30. The bottom plate 53 defines a U-shaped cutout 533 corresponding to the cutout 513 of the top plate 51 to prevent an interference of the vapor chamber 50 with the bracket 30. A central portion of the bottom plate 53 extends downwardly to contact with the first and second processors 21, 23. Two U-shaped recesses 54 are defined at lateral ends of the bottom plate 53 corresponding to the two flanges 316 of the bracket 30, respectively.

Two mounting members 60 are welded on a bottom surface of the bottom plate 53 and received in the two recesses 54 of the bottom plate 53, respectively. Each of the mounting members 60 is a U-shaped metal sheet and comprises two parallel mounting plates 61 and a linking plate 63 interconnecting the mounting plates 61. The mounting plate 61 defines an engaging hole 612 to engagingly receive the screw 92. Therefore, it is not necessary to form holes in the vapor chamber 50 directly and a chance of destroying the wick structure of the vapor chamber 50 due to the formation of the holes in the vapor chamber 50 is avoided.

The fin group 70 is mounted on a top surface of the top plate 51 to dissipate heat absorbed by the vapor chamber 50. The fin group 70 comprises a plurality of rectangular fins 71. The fins 71 are parallel to and spaced from each other. A bevel 73 is formed at a top, right corner of the fin group 70 to guide airflow generated by the fan 40 to the fin group 70.

The fan cover 80 is made of a bent metal sheet and comprises a first covering portion 81 and a second covering portion 83 extending outwardly from an end of the first covering portion 81. The first covering portion 81 comprises an elongated first top plate 813 and two first sidewalls 815 extend downwardly from opposite edges of the first top plate 813. The first covering portion 81 covers the fin group 70 and the vapor chamber 50 therein. The second covering portion 83 comprises a semicircular second top plate 833 horizontally extending from a lateral end of the first top plate 813 of the first covering portion 81, and a second sidewall 835 extending downwardly from an outer edge of the second top plate 833. An opening 831 is defined at a central portion of the second top plate 833 of the second covering portion 83 to guide airflow into the fan cover 80. The fan 40 is received in the second covering portion 83 just below the opening 831.

Figure 3:
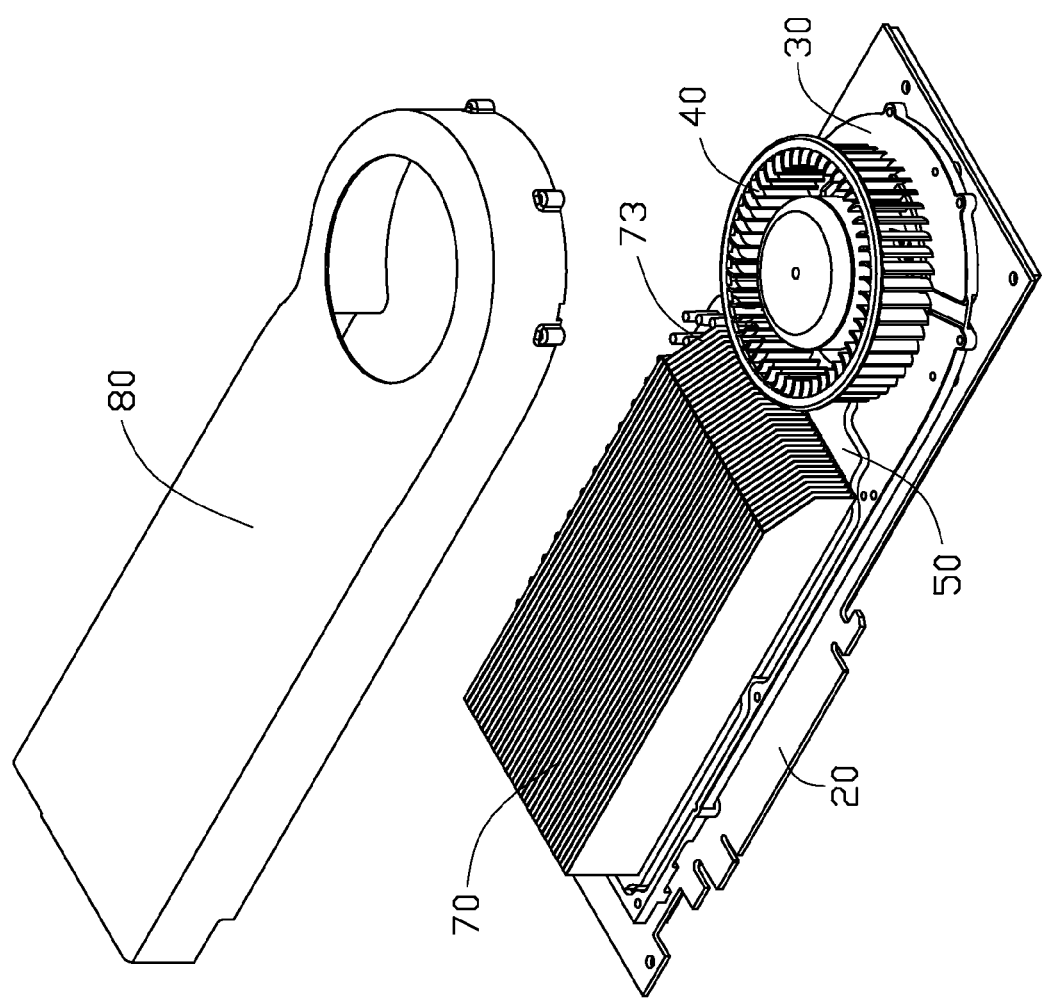
FIG. 3 is an assembled view of the heat dissipation device and the add-on card of FIG. 1, with a fan cover being disassembled from the heat dissipation device for clarity.
Figure 4:
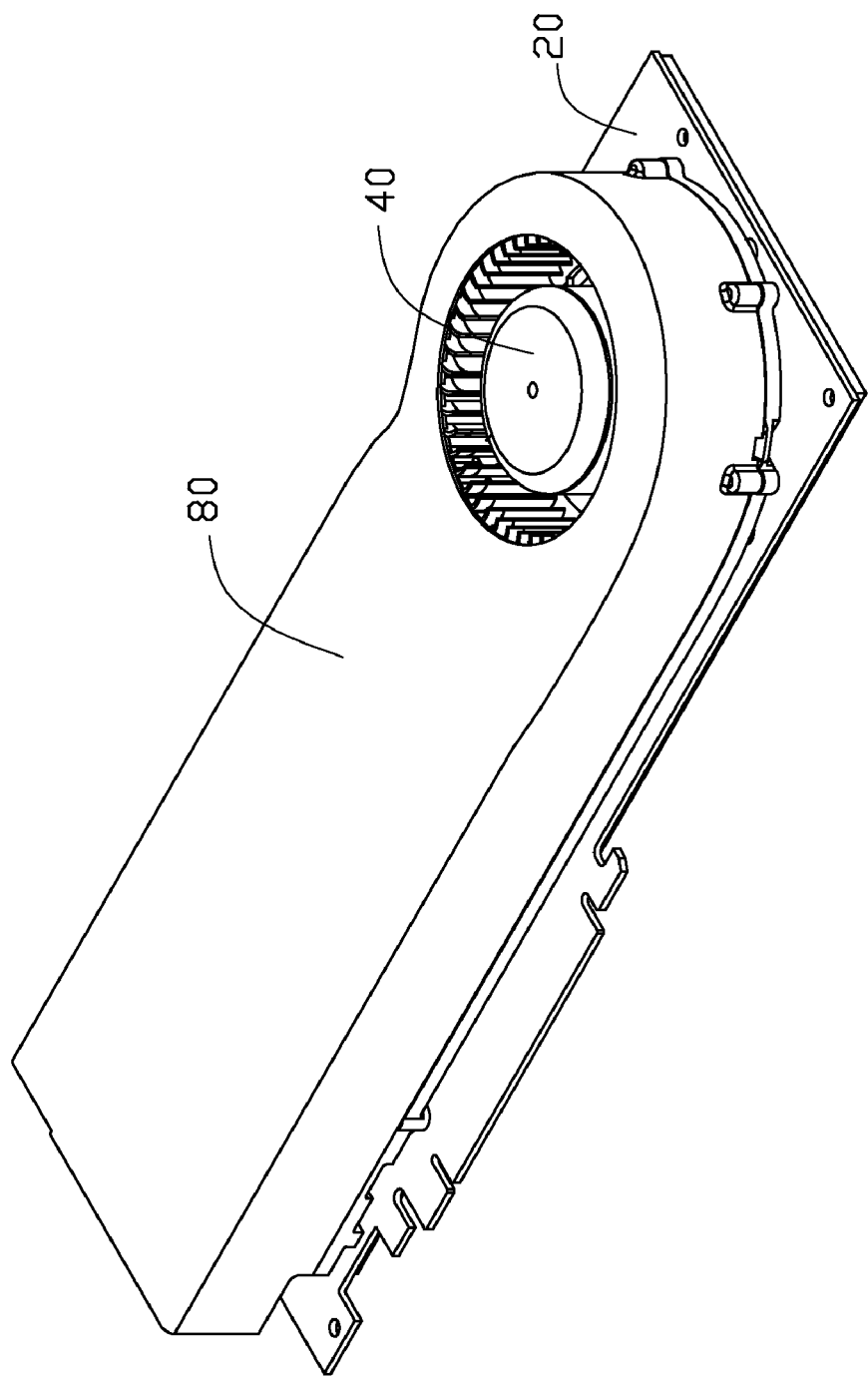
FIG. 4 is an assembled view of the heat dissipation device of FIG. 1 and the add-on card, with the fan cover being assembled to the heat dissipation device.

Referring to FIGS. 3-4 also, in assembly, the two mounting members 60 are welded on the bottom surface and received in the two recesses 54 of the bottom plate 53. The mounting members 60 correspond to the flanges 316 of the bracket 30, respectively, and the engaging holes 612 correspond to the mounting holes 3165 of the supporting plate 3162 of the flange 316. The fin group 70 is mounted on the top surface of the top plate 51. The bracket 30 is secured on a top surface of the add-on card 20. In this state, the first and second processors 21, 23 are received in the opening 314 of the engaging portion 31 of the bracket 30 and the other electronic component 25 of the add-on card 20 are contacted by the bottom surface of the engaging portion 31. The mounting members 60 sit on the flanges 316 of the engaging portion 31 to mount the vapor chamber 50 on the bracket 30. In this state, the central portion of the bottom plate 53 of the vapor chamber 50 thermally contacts the first and second processors 21, 23. The right side of the fin group 70 is oriented towards the extending portion 33 of the bracket 30. The fan 40 is mounted on the central portion of the extending portion 33. The fan cover 80 abuts against edges of the top surface of the bracket 30. The heat absorbing plate 11 of the back plate 10 is located at the bottom of the add- on card 20. A number of screws 91 extend through the heat absorbing plate 11, the add-on card 20, the bracket 30 and engage with the fan cover 80 to assembly the fan cover 80, the bracket 30, the add-on card 20 and the heat absorbing plate 11 together. In this state, the first covering portion 81 of the fan cover 80 covers the fin group 70 and the vapor chamber 50. The second covering portion 83 of the fan cover 80 covers the fan 40. The two supporting members 13 are received in the two openings 112. Four screws 92 extend through four arms (not labeled) of the supporting members 13, the add-on card 20, the mounting holes 3165 of the supporting plates 3162 of the flanges 316 and engaging in the engaging holes 612 of the mounting members 60. Four screws 92 extend through another four arms of the supporting members 13 and engage with the add-on card 20. Therefore, the vapor chamber 50, the bracket 30, the add-on card 20 and the supporting members 13 are assembled together.

In use, heat generated by the first processor 21 is larger than that of the second processor 23. In the present disclosure, the vapor chamber 50 connects with the first and second processors 21, 23 simultaneously. Therefore, heat generated by the first and second processors 21, 23 are evenly distributed on the vapor chamber 50 by the wick structure and the working fluid and dissipated by the fin group 70. Thus, the overheating of the first processor 21 can be avoided.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device for dissipating heat generated from a plurality of processors which is mounted on an add-on card, the heat dissipation device comprising:
   a vapor chamber thermally contacting with the processors;
   a mounting member mounted on a bottom surface of the vapor chamber; and
   two first screws extending through the add-on card and engaging with the mounting member to assemble the vapor chamber on the add-on card;
   wherein the mounting member is a metal sheet and comprises two spaced mounting plates and a linking plate interconnecting the mounting plates, and each of the mounting plates defines an engaging hole to receive one of the two first screws.

2. The heat dissipation device as claimed in claim 1, wherein a first recess is defined in an end of the vapor chamber, and the mounting member is received in the first recess.

3. The heat dissipation device as claimed in claim 2, wherein another end of the vapor chamber defines a second recess, another mounting member is received in the second recess and engages with two second screws.

4. The heat dissipation device as claimed in claim 3, wherein the vapor chamber comprises a top plate and a bottom plate engaging with the top plate, two ends of the bottom plate define the first and second recesses, and the bottom plate thermally contacts with the processors.

5. The heat dissipation device as claimed in claim 4 further comprising a bracket processors which is mounted on an add-on card, the heat dissipation device comprising:
   a vapor chamber thermally contacting with the processors;
   a mounting member mounted to a bottom surface of the vapor chamber;
   a plurality of screws extending through the add-on card and engaging with the mounting member to assemble the vapor chamber on the add-on card;
   a heat absorbing plate fixed on a bottom of the add-on card and thermally contacting with the add-on card; and
   two cross-shaped supporting members embedded in the heat absorbing plate and abutting against the add-on card at positions where the processors are located.

6. The heat dissipation device as claimed in claim 5, wherein two flanges are formed by the bracket and located at two lateral ends of the opening, respectively, the two mounting members sit on the two flanges, respectively.

7. The heat dissipation device as claimed in claim 5, wherein a number of pins extend upwardly from a side of the bracket.

8. The heat dissipation device as claimed in claim 5, wherein an extending portion extends outwardly from an end of the bracket and a fan is mounted on the extending portion to cool the vapor chamber.

9. The heat dissipation device as claimed in claim 8, wherein a fin group is mounted on a top surface of the top plate.

10. The heat dissipation device as claimed in claim 9, wherein a bevel is formed at a top corner of an end of the fin group near to the fan to guide airflow generated by the fan to the fin group.

11. The heat dissipation device as claimed in claim 9, wherein a fan cover comprises a first cover covering the fin group and a second cover covering the fan.

12. The heat dissipation device as claimed in claim 1, wherein a heat absorbing plate is fixed on a bottom of the add-on card and thermally contact with the add-on card.

13. The heat dissipation device as claimed in claim 12, wherein two cross-shaped supporting members are embedded in the heat absorbing plate and abut against the add-on card at positions where the processors are located.

14. A heat dissipation device for dissipating heat generated from a plurality of portion to cool the vapor chamber.

15. The heat dissipation device as claimed in claim 14, wherein the mounting member is a metal sheet and comprises two spaced mounting plates and a linking plate interconnecting the mounting plates, and each of the mounting plates defines an engaging hole to receive one of the screws.

16. The heat dissipation device as claimed in claim 14, wherein a recess is defined in an end of the vapor chamber, and the mounting member is received in the recess.

17. The heat dissipation device as claimed in claim 14 further comprising a bracket mounted on a top surface of the add-on card, wherein the bracket defines an opening enclosing the processors therein, the vapor chamber sits on the bracket and extends through the opening to contact with the processors.

18. The heat dissipation device as claimed in claim 17, wherein a flange is formed by the bracket and located at an end of the opening, and the mounting member sits on the flange.

19. The heat dissipation device as claimed in claim 17, wherein a number of pins extend upwardly from a side of the bracket.

20. The heat dissipation device as claimed in claim 17, wherein an extending portion extends outwardly from an end of the bracket and a fan is mounted on the extending mounted on a top surface of the add-on card, wherein the bracket defines an opening enclosing the processors therein, the vapor chamber sits on the bracket and extends through the opening to contact with the processors.

* * * * *